(12) United States Patent
Sumioka

(10) Patent No.: US 10,186,990 B2
(45) Date of Patent: Jan. 22, 2019

(54) DRIVING APPARATUS THAT DRIVES MOVING BODY IN MULTIPLE DIRECTIONS, CONTROL METHOD THEREFOR, STORAGE MEDIUM, AND ELECTRONIC APPARATUS

(71) Applicant: CANON KABUSHIKI KAISHA, Tokyo (JP)

(72) Inventor: Jun Sumioka, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/824,353

(22) Filed: Nov. 28, 2017

(65) Prior Publication Data

US 2018/0159447 A1    Jun. 7, 2018

(30) Foreign Application Priority Data

Dec. 7, 2016   (JP) ................................. 2016-237535
Nov. 6, 2017   (JP) ................................. 2017-213926

(51) Int. Cl.

| H02K 41/00 | (2006.01) |
|---|---|
| H02P 1/54 | (2006.01) |
| H02P 5/00 | (2016.01) |
| H02P 5/46 | (2006.01) |
| H02N 2/06 | (2006.01) |
| H02N 2/02 | (2006.01) |
| H01L 41/09 | (2006.01) |
| H01L 41/04 | (2006.01) |

(52) U.S. Cl.
CPC ............. *H02N 2/06* (2013.01); *H01L 41/042* (2013.01); *H01L 41/09* (2013.01); *H02N 2/028* (2013.01)

(58) Field of Classification Search
CPC .................................. H02H 2/06; G05B 15/02
USPC .......................................................... 318/38
See application file for complete search history.

(56) References Cited

FOREIGN PATENT DOCUMENTS

| JP | H06311765 A | 11/1994 |
|---|---|---|
| JP | 2009225503 A | 10/2009 |

*Primary Examiner* — Erick Glass
(74) *Attorney, Agent, or Firm* — Rossi, Kimms & McDowell LLP

(57) ABSTRACT

A driving apparatus which reduces power consumption as compared to conventional driving apparatuses. A voltage amplitude of first AC voltages is controlled based on a relative angle between a moving direction of a moving body, which is indicated by a driving command for moving the moving body, and a driving direction of a first vibrator, and a voltage amplitude of second AC voltages is controlled based on a relative angle between the moving direction and a driving direction of a second vibrator. Each of the first vibrator and the second vibrator is controlled based on a deviation between the driving command and a detected position of the moving body while the first AC voltages and the second AC voltages are being controlled. The driving direction of the first vibrator and the driving direction of the second vibrator cross each other.

33 Claims, 15 Drawing Sheets

MODE A

MODE B

FIG. 6A $$M1 = \cos(45\deg)\left\{\begin{bmatrix}-\Delta X\\0\end{bmatrix} + \begin{bmatrix}0\\\Delta Y\end{bmatrix} + R\theta\begin{bmatrix}d3\text{-}x\\d3\text{-}y\end{bmatrix}\right\}$$

$$M2 = \cos(45\deg)\left\{\begin{bmatrix}-\Delta X\\0\end{bmatrix} + \begin{bmatrix}0\\-\Delta Y\end{bmatrix} + R\theta\begin{bmatrix}-d3\text{-}x\\d3\text{-}y\end{bmatrix}\right\}$$

$$M3 = \cos(45\deg)\left\{\begin{bmatrix}\Delta X\\0\end{bmatrix} + \begin{bmatrix}0\\-\Delta Y\end{bmatrix} + R\theta\begin{bmatrix}-d3\text{-}x\\-d3\text{-}y\end{bmatrix}\right\}$$

$$M4 = \cos(45\deg)\left\{\begin{bmatrix}\Delta X\\0\end{bmatrix} + \begin{bmatrix}0\\\Delta Y\end{bmatrix} + R\theta\begin{bmatrix}d3\text{-}x\\-d3\text{-}y\end{bmatrix}\right\}$$

FIG. 6B $$R\theta = \begin{bmatrix}\cos(\Delta\Theta)-1 & -\sin(\Delta\Theta)\\ \sin(\Delta\Theta) & \cos(\Delta\Theta)-1\end{bmatrix}$$

FIG. 6C

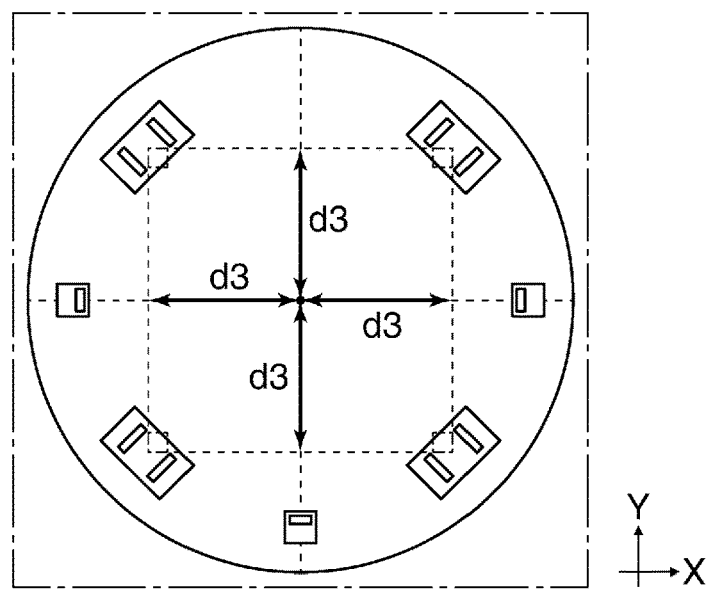

$x = Ex + d1 \cdot (1-\cos\theta)$
$y = Ey - d1 \cdot (1-\cos\theta)$
$\theta = (Ey - E\theta)/d1$

FIG. 9A $Dir = \tan^{-1}(y/x)$

FIG. 9B pw1=50% x abs{cos(135deg-Dir)}
pw2=50% x abs{cos(45deg-Dir)}
pw3=50% x abs{cos(135deg-Dir)}
pw3=50% x abs{cos(45deg-Dir)}

DRIVING APPARATUS THAT DRIVES MOVING BODY IN MULTIPLE DIRECTIONS, CONTROL METHOD THEREFOR, STORAGE MEDIUM, AND ELECTRONIC APPARATUS

BACKGROUND OF THE INVENTION

Field of the Invention

The present invention relates to a driving apparatus, a control method therefor, a storage medium, and an electronic apparatus, and in particular to a multi-degree of freedom driving apparatus that combines vibrations of a plurality of vibrators to drive a moving body in multiple directions.

Description of the Related Art

Conventionally, as a driving apparatus, there is known, for example, what is called a multi-degree of freedom driving apparatus which uses a linear actuator to drive a moving body in directions of an X-axis, a Y-axis, and θ direction (θ refers to an angle through which the moving body has rotated counterclockwise from the X-axis that is a starting point) (see Japanese Laid-Open Patent Publication (Kokai) No. 2009-225503).

FIGS. 14A and 14B are views useful in explaining an example of the conventional multi-degree of freedom driving apparatus. FIG. 14A shows an arrangement of the multi-degree of freedom driving apparatus, and FIG. 14B shows the multi-degree of freedom driving apparatus as seen from the side.

The multi-degree of freedom driving apparatus has a base plate 1, on which a plurality of vibrators 2, 3, and 4 is arranged. As described later, vibrations of the vibrators 2, 3, and 4 drive a moving body 5. Position sensors 6, 7, and 8 as well are arranged on the base plate 1. The position sensor 6 detects a position of the moving body 5 in an X direction, and the position sensors 7 and 8 detect a position of the moving body 5 in a Y direction.

Each of the vibrators 2, 3, and 4 is a vibrating body that has a vibrating member, which has projecting portions, and a piezoelectric element, and the vibrating member and the piezoelectric element are configured as an integral unit by adhesion or the like. The vibrators 2, 3, and 4 are mounted on the base plate 1 via a mounting member (not shown). The projecting portions abut against the moving body 5, which in turn is supported by the vibrating members.

Scale units 6', 7', and 8' are disposed on the moving body 5, and these scale units 6', 7', and 8' are located above the position sensors 6, 7, and 8, respectively. With this arrangement, when, for example, the scale unit 6' moves in the X direction in response to movement of the moving body 5, the position sensor 6 outputs an X direction position signal according to a travel distance of the scale unit 6'. Likewise, in response to movement of the scale units 7' and 8' in the Y direction, the respective position sensors 7 and 8 output Y direction position signals.

In the multi-degree of freedom driving apparatus shown in the figures, the moving body 5 is driven in a direction obtained by vector composition of driving forces of the vibrators 2, 3, and 4.

With the multi-degree of freedom driving apparatus described above, an image pickup apparatus such as a digital camera is able to perform an anti-vibrating operation. In an anti-vibrating mechanism of the image pickup apparatus, a dual-axis gyroscopic sensor is used to detect amounts of shake in an X direction and a Y direction, and a position command signal XY is generated so as to correct for the amounts of shake. By controlling the multi-degree of freedom driving apparatus controlled based on the position command signal XY, the moving body 5 which is a lens (anti-vibrating lens) is driven to perform the anti-vibrating operation.

To save power in the multi-degree of freedom driving apparatus, it is preferred that driving voltages applied to the plurality of vibrators are varied according to driving conditions. The reason for this is that in the multi-degree of freedom driving apparatus, driving forces of the plurality of vibrators are subjected to vector composition, and hence driving forces and loads required for the respective vibrators vary with driving directions of the moving body.

In the conventional driving method, however, driving voltages for the respective vibrators are not optimized based on driving directions of the moving body. Power consumption can be reduced by lowering driving voltages for the plurality of vibrators across the board, but this may compromise the ease of control for anti-vibrating performance or the like.

On the other hand, in the multi-degree of freedom driving apparatus described in Japanese Laid-Open Patent Publication (Kokai) No. 2009-225503, characteristics of the vibrators are determined according to a travel distance of the moving body or controlled variables of the respective vibrators, driving parameters are determined so as to equalize or optimize the characteristics. The driving voltages are adjusted so as to absorb the variations in the vibrators, but the driving voltages are not optimized according to driving conditions such as driving directions.

SUMMARY OF THE INVENTION

The present invention provides a driving apparatus which reduces power consumption as compared to conventional driving apparatuses, a control method therefor, a storage medium, and an electronic apparatus.

Accordingly, the present invention provides a driving apparatus that has a first vibrator vibrated through application of a plurality of first AC voltages, and a second vibrator vibrated through application of a plurality of second AC voltages, and moves a moving body by a driving force of the first vibrator and a driving force of the second vibrator, comprising a detecting unit configured to detect a position of the moving body, a first control unit configured to control a voltage amplitude of the plurality of first AC voltages and a voltage amplitude of the plurality of second AC voltages, and a second control unit configured to control each of the first vibrator and the second vibrator based on a deviation between a driving command for moving the moving body and a result of detection by the detecting unit while the plurality of first AC voltages and the plurality of second AC voltages are being controlled by the first control unit, wherein a driving direction of the first vibrator and a driving direction of the second vibrator cross each other, wherein the first control unit is configured to control the voltage amplitude of the plurality of first AC voltages based on a relative angle between a moving direction of the moving body, which is indicated by the driving command, and the driving direction of the first vibrator, and wherein the first control unit is configured to control the voltage amplitude of the plurality of second AC voltages based on a relative angle between the moving direction of the moving body and the driving direction of the second vibrator.

According to the driving apparatus which is an aspect of the present invention, power consumption is reduced as compared to conventional driving apparatuses.

Further features of the present invention will become apparent from the following description of exemplary embodiments (with reference to the attached drawings).

BRIEF DESCRIPTION OF THE DRAWINGS

FIGS. 6A to 6C are diagrams useful in explaining matrix computations performed by a multiple-input multiple-output matrix computation unit appearing in FIG. 5.

FIGS. 9A and 9B are views useful in explaining examples of pulse width calculation formulas for use in the pulse width control by the pulse width control unit appearing in FIG. 3.

DESCRIPTION OF THE EMBODIMENTS

Hereafter, an example of a driving apparatus (hereafter referred to as a multi-degree of freedom driving apparatus) according to an embodiment of the present invention will be described with reference to the drawings. It should be noted that in the following description, the multi-degree of freedom driving apparatus is used for an anti-vibration mechanism of an image pickup apparatus which is an example of an electronic apparatus, but the multi-degree of freedom driving apparatus may also be used for electronic apparatuses other than the image pickup apparatus. For example, the multi-degree of freedom driving apparatus may be used for a control apparatus that controls a stage movable in directions of three axes.

Figure 1A:
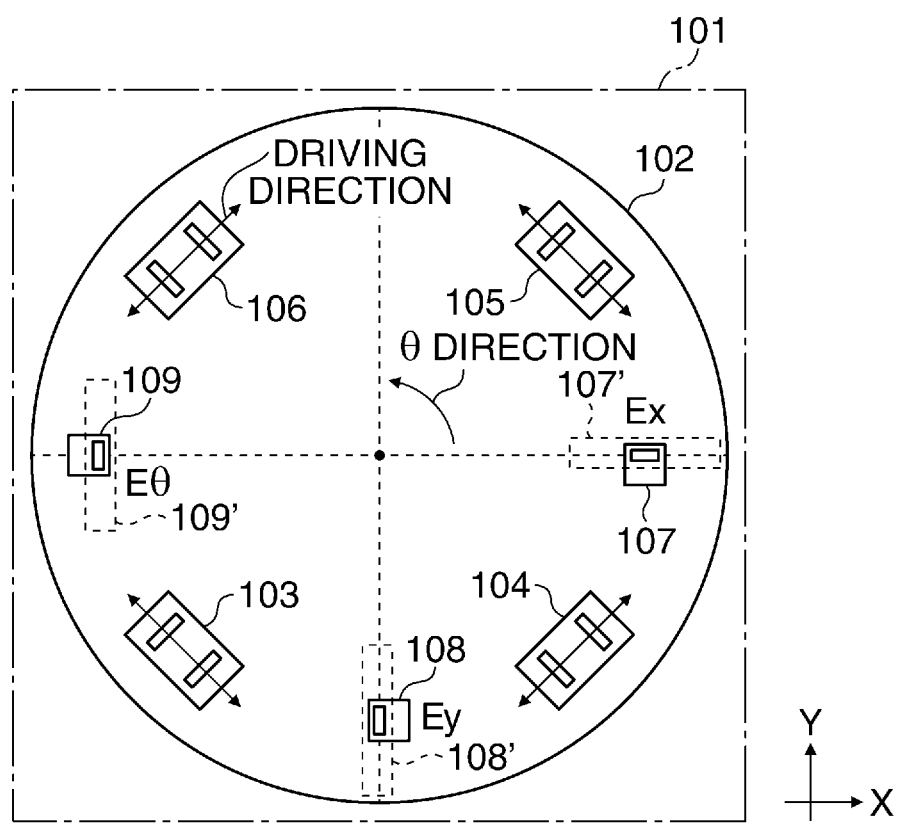
FIGS. 1A and 1B are views useful in explaining an example of a driving apparatus according to an embodiment of the present invention.
Figure 1B:
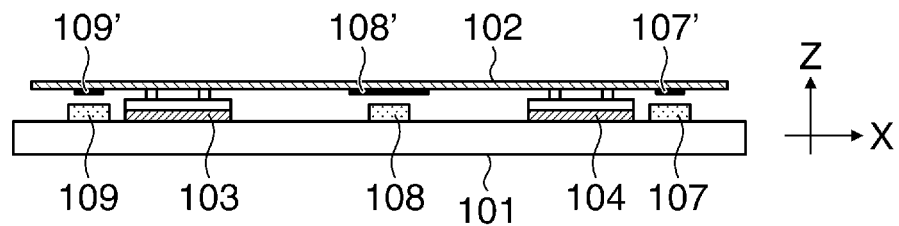

FIGS. 1A and 1B are views useful in explaining an example of the multi-degree of freedom driving apparatus according to the embodiment of the present invention. FIG. 1A shows an arrangement of the multi-degree of freedom driving apparatus, and FIG. 1B shows the multi-degree of freedom driving apparatus as seen from the side.

The multi-degree of freedom driving apparatus shown in the figures uses a plurality of linear actuators to drive a moving body in an X-axis direction and a Y-axis direction as well as a direction represented by an angle θ. It should be noted that the angle θ represents an angle through which the moving body rotates counterclockwise from the X axis.

In the anti-vibration mechanism for use in the image pickup apparatus such as a digital camera (hereafter referred to as the camera), a dual-axis gyroscopic sensor is used to detect amounts of shake in the X-axis direction and the Y-axis direction. Position command signals XY are then generated so as to correct for the amounts of shake. Namely, in the anti-vibration mechanism, anti-vibration control is provided by controlling the multi-degree of freedom driving apparatus based on the position command signals XY to drive a lens (anti-vibration lens) that is the moving body.

The multi-degree of freedom driving apparatus shown in the figures has a base plate 101, and a plurality of vibration-type motors (vibrators) 103, 104, 105, and 106 is arranged on the base plate 1. As described later, a moving body 102 is driven by driving the vibration-type motors 103, 104, 105, and 106. It should be noted here that the moving body 102 is, for example, an anti-vibration lens. In the following description, the vibration-type motors 103, 104, 105, and 106 will be collectively referred to as the vibration-type motors 103 to 106 or the vibration-type motors 103, 104, 105, and 106 but sometimes individually referred to as the first vibration-type motor 103, the second vibration-type motor 104, the third vibration-type motor 105, and the fourth vibration-type motor 106.

As shown in the figures, the vibration-type motors 103, 104, 105, and 106 are arranged in a third quadrant, a fourth quadrant, a first quadrant, and a second quadrant, respectively, of an XY coordinate system. Driving directions of the vibration-type motors 103 and 105 cross driving directions of the vibration-type motors 104 and 106.

Position sensors (detecting units) 107, 108, and 109 are arranged on the base plate 1. The position sensor 107 detects a position (current position) of the moving body 102 in an X direction. The position sensor 108 detects a position of the moving body 102 in a Y direction. The position sensor 109 detects a position of the moving body 102 in a direction of an angle θ.

Each of the vibration-type motors 103 to 106 is a vibrator that has a vibrating member, which has two projecting portions, and a piezoelectric element, and the vibrating member and the piezoelectric element are configured as an integral unit by adhesion or the like. The vibration-type motors 103 to 106 are mounted on the base plate 1 via a mounting member (not shown), and their projecting portions are brought into pressure contact with the moving body 102.

Scale units 107', 108', and 109' are disposed on the moving body 102, and these scale units 107', 108', and 109' are located above the position sensors 107, 108, and 109, respectively. With this arrangement, when, for example, the scale unit 107' moves in the X direction in response to movement of the moving body 102, the position sensor 107 outputs an X direction position signal according to a travel distance of the scale unit 107'. Likewise, in response to movement of the scale unit 108' in the Y direction and movement of the scale unit 109' in the θ direction, the position sensors 108 and 109 output a Y direction position signal and a θ direction position signal, respectively.

In the multi-degree of freedom driving apparatus shown in the figures, the moving body 102 is driven in a direction obtained by vector composition of driving forces of the vibration-type motor 103 to 106.

Figure 2A:
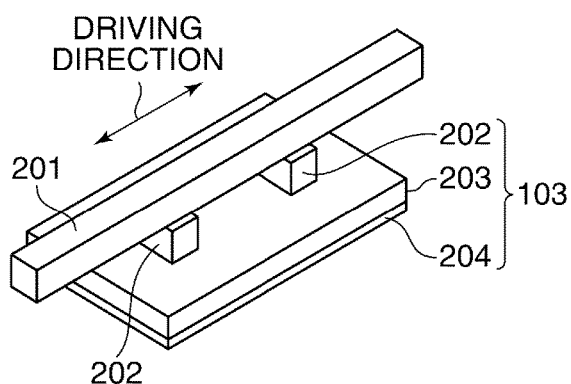
FIGS. 2A to 2D are views useful in explaining operation of vibration-type motors appearing in FIGS. 1A and 1B.
Figure 2B:
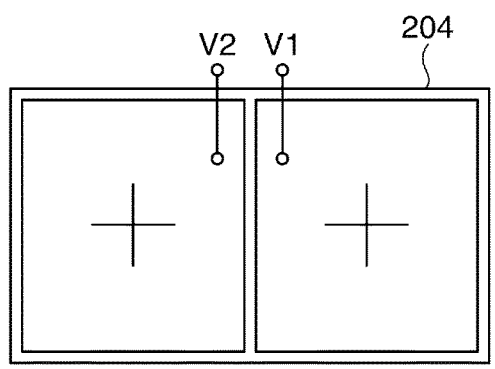
Figure 2C:
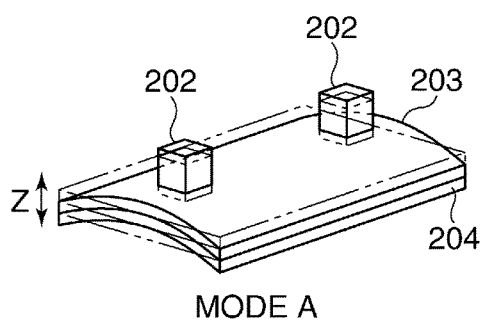
Figure 2D:
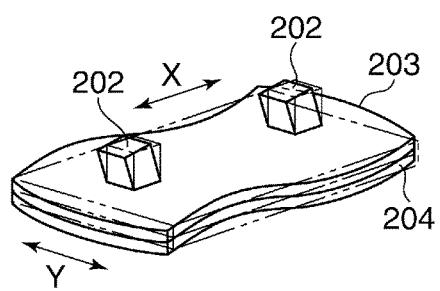

FIGS. 2A to 2D are views useful in explaining operation of the vibration-type motors appearing in FIGS. 1A and 1B. FIG. 2A is a perspective view showing an example of an arrangement of the vibration-type motors, and FIG. 2B is a view showing electrode patterns on a piezoelectric element appearing in FIG. 2A. FIG. 2C is a perspective view showing an example of a vibration mode generated in the vibration-type motors, and FIG. 2D is a perspective view showing another example of a vibration mode generated in the vibration-type motors.

It should be noted that in FIGS. 2A to 2D, the moving body is denoted by a reference numeral 201. Here, the vibration-type motors 103 to 106 have the same arrangement, and therefore, an arrangement of only the vibration-type motor 103 will be described hereafter.

As shown in FIG. 2A, the vibration-type motor 103 has a piezoelectric element 204, which is adhered to an elastic body 203. By applying AC voltages (driving signals) to the piezoelectric element 204, two modes of vibrations shown in FIGS. 2C and 2D, for example, are generated, which causes the moving body 201 being in pressure contact with projecting portions 202 to move in directions indicated by arrows.

As shown in FIG. 2B, the electrode patterns are formed on the piezoelectric element 204, and for example, in the piezoelectric element 204, two equal electrode areas are formed side by side in a longitudinal direction, and polarizing directions of the electrode areas are the same (+). An AC voltage V1 is applied to a right-side one of the two electrode areas in FIG. 2B, and an AC voltage V2 is applied to a left-side one of the two electrode areas.

Assume that the AC voltages V1 and V2 are of a frequency close to a resonance frequency in the first vibration mode (mode A) and in the same phase. In this case when such AC voltages are applied, the piezoelectric element 204 (the two electrode areas) expands at one moment and contracts at another moment. As a result, vibrations in the mode A shown in FIG. 2C are generated in the vibration-type motor 103.

On the other hand, assume that the AC voltages V1 and V2 are of a frequency close to a resonance frequency in the second vibration mode (mode B) and 180° out of phase with each other. In this case, when such AC voltages are applied, the right-side electrode area of the piezoelectric element 204 contracts and the left-side electrode area of the piezoelectric element 204 expands at one moment. This is the other way around at another moment. As a result, vibrations in the mode B shown in FIG. 2D are generated in the vibration-type motor 103.

By combining these two vibration modes together, the moving body 201 is driven in directions indicated by arrows shown in FIG. 2A. It should be noted that the occurrence ratio of the mode A to the mode B is changeable by changing a phase difference between the AC voltages input to the two equal electrode areas. The speed of moving body 201 is changeable by changing the occurrence ratio of the mode A to the mode B in the vibration-type motor 103.

Figure 3:
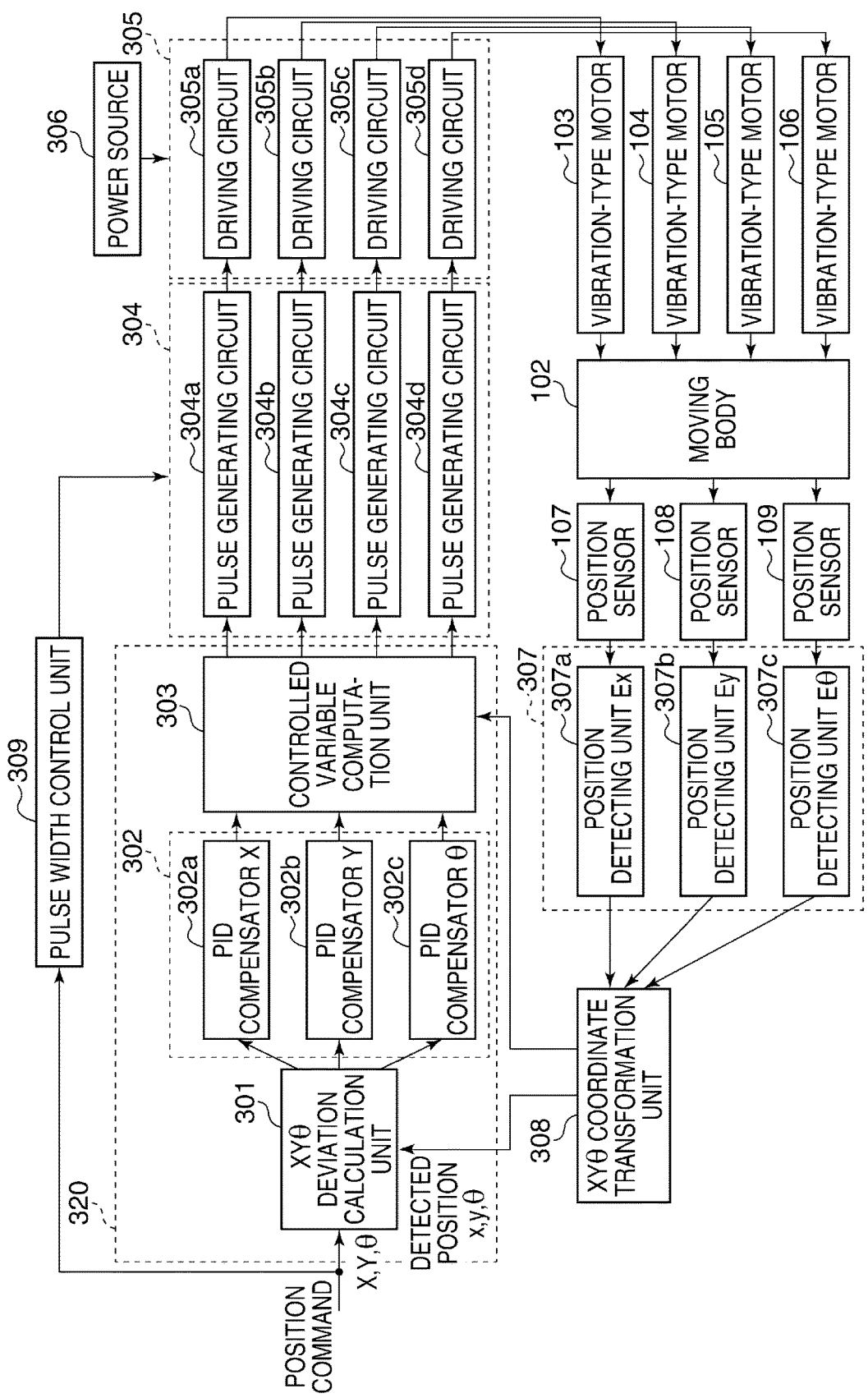
FIG. 3 is a block diagram useful in explaining an example of a control system used in the driving apparatus appearing in FIGS. 1A and 1B.

FIG. 3 is a block diagram useful in explaining an example of a control system used in the multi-degree of freedom driving apparatus appearing in FIGS. 1A and 1B.

A controller (not shown) gives position commands (driving commands) X, Y, and θ to an XYθ deviation calculation unit 301. On the other hand, detected positions x, y, and θ obtained by an XYθ coordinate transformation unit 308, to be described later, are given to the XYθ deviation calculation unit 301. The XYθ deviation calculation unit 301 obtains deviations between the position commands and the detected positions and sends deviation signals relating to X, Y, and θ to a PID compensation unit 302.

The PID compensation unit 302 has PID compensators 302a, 302b, and 302c relating to X, Y, and θ. These PID compensators 302a, 302b, and 302c output control signals (controlled variables) relating to X, Y, and θ based on the deviation signals relating to X, Y, and θ. It should be noted that the PID compensator 302a is for summing outputs obtained by proportion (P), integration (I), and differentiation (D) processes. The PID compensation unit 302 is used to provide stable and accurate control by compensating for a phase delay and gain of a controlled object.

The control signals which are output from the PID compensation unit 302 are given to a controlled variable computation unit 303. Based on the control signals, the controlled variable computation unit 303 converts the controlled variables relating to X, Y, and θ into controlled variables for the four vibration-type motors 103 to 106 by matrix computations. The controlled variables are information indicating frequencies and phase differences which are control parameters for the vibration-type motors 103 to 106 and sent to a pulse generating unit 304. The pulse generating unit 304 has four pulse generating circuits 304a to 304d and generates pulse signals with frequencies and phase differences thereof varying with the controlled variables. It should be noted that a digital division circuit, a VOC (voltage control oscillator), or the like is used as each of the pulse generation circuits 304a to 304d. The deviation calculation unit 301, the PID compensation unit 302, and the controlled variable computation unit 303 constitute a control unit 320 (second control unit).

As shown in the figure, a pulse width control unit 309 (first control unit) supplies pulse width information to the pulse generating unit 304. The pulse width control unit 309 obtains a moving direction of the moving body 102 based on the position commands X, Y, and θ, and based on the moving direction, changes pulse widths of pulse signals for controlling the plurality of vibration-type motors 103 to 106. The pulse generating unit 304 then changes the pulse widths based on the pulse width information. Voltage amplitudes of the AC voltages applied to the vibration-type motors 103 to 106 are controlled by controlling the pulse widths of the pulse signals. Controlling the pulse widths of the pulse signals based on the moving direction of the moving body 102 controls the voltage amplitudes of the AC voltages applied to the vibration-type motors 103 to 106 and reduces generation of undesired driving force in the vibration-type motors 103 to 106 to save power.

As described above, in the present embodiment, feedback control by the PID compensation unit 302 and the controlled variable computation unit 303 based on the deviations between the position commands and the detected positions and feed-forward control by the pulse width control unit 309 over the voltage amplitudes of the AC voltages based on the moving direction of the moving body 102 are performed in combination. The feedback control differs from the feed-forward control because in the feedback control, the controlled variables vary according to degrees of the deviations between the position commands and the detected positions, whereas in the feed-forward control, the controlled variables are determined according to the moving direction of the moving body 102 based on the position commands irrespective of detection results obtained by the detection unit 307. Namely, the feed-forward control in which the voltage amplitudes of the AC voltages are controlled enables the vibration-type motors 103 to 106 to generate required driving forces before detection by the detection unit 307, and this contributes to power saving. In the present embodiment, at least the phase difference between the AC voltages or the frequencies are controlled by the feedback control, and the voltage amplitudes are controlled by the feed-forward control. Thus, when certain position commands have been issued, the voltage amplitudes of the AC voltages applied to the respective vibration-type motors 103 to 106 are controlled based on relative angles between the moving direction of the moving body 102 determined based on the position commands and driving directions of the respective vibration-type motors 103 to 106, and with the voltage amplitudes being controlled based on the moving direction, the feedback control is provided based on the deviations between the position commands and the detection results. When the moving direction of the moving body 102 is changed due to different position commands being issued, the pulse width control unit 309 changes the pulse widths of the pulse signals, and as a result, the voltage amplitudes of the AC voltages are controlled.

The control over the pulse widths by the pulse width control unit 309 is aimed at minimizing undesired power that does not contribute to movement of the moving body 102. The speed or the moving direction is basically controlled based on the frequencies and the phase difference. As described earlier, the information indicative of the frequencies and the phase difference is output from the controlled variable computation unit 303 to control the moving directions and the speeds of the vibration-type motors 103 to 106 as described later.

The first to fourth pulse signals which are output from the pulse generating unit 304 are sent to a driving unit 305. The driving unit 305 has four driving circuits 305a, 305b, 305c, and 305d. In response to the first to fourth pulse signals, the respective driving circuits 305a, 305b, 305c, and 305d output voltages supplied from a power source 306 as first to fourth two-phase AC voltages, respectively, with phases varying within a range of 0° to 120°.

Each of the driving circuits 305a, 305b, 305c, and 305d has a step-up circuit using a transformer, a step-up circuit using LC resonance, or the like, and performs a switching action at the input of the first to fourth pulse signals to boost a DC voltage supplied from the power source 306 to a desired voltage.

Figure 15A:
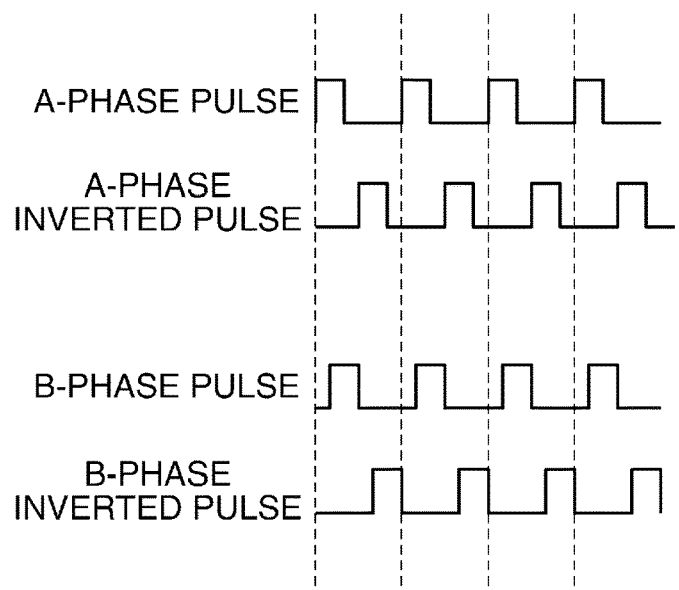
FIGS. 15A and 15B are views useful in explaining arrangements of the pulse generating unit and a driving unit according to the present embodiment of the present invention.
Figure 15B:
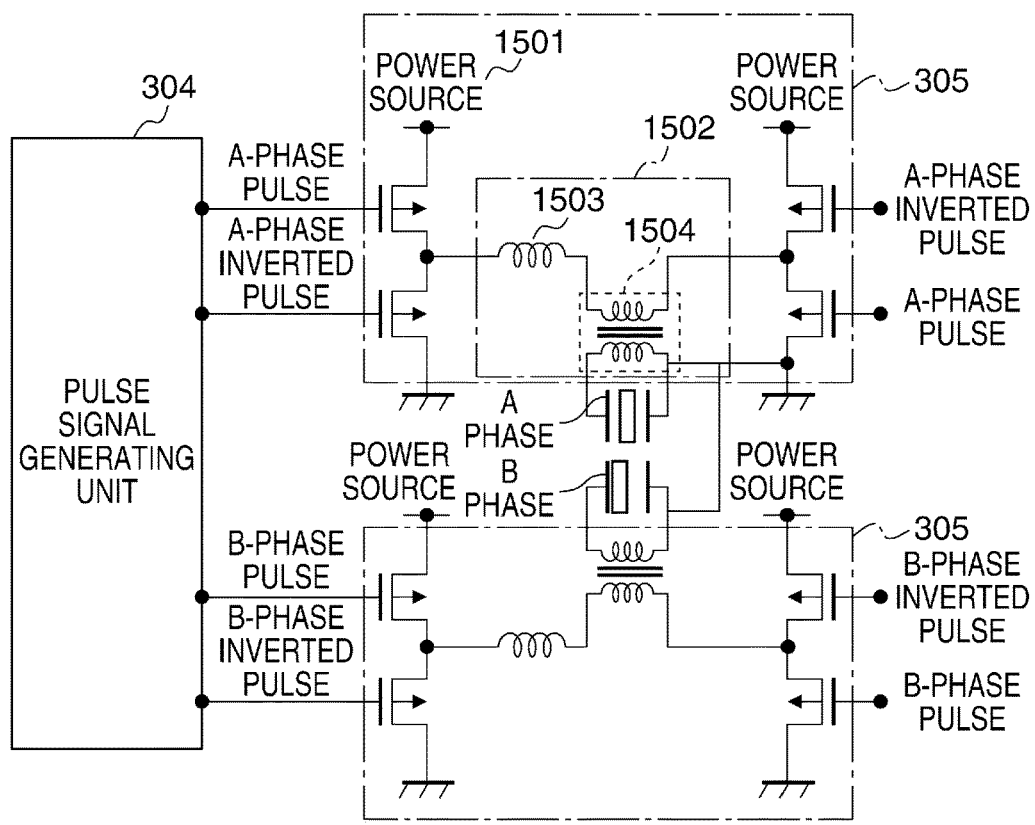

Next, referring to FIGS. 15A and 15B, a description will be given of an arrangement of an AC voltage generating unit that has the pulse generating unit 304 and the driving unit 305 according to the present embodiment. FIG. 15A shows two-phase AC pulse signals output from the pulse generating unit 304. FIG. 15B is a diagram useful in explaining arrangements of the pulse generating unit 304 and the driving unit 305. It should be noted that FIG. 15B shows a circuit of the pulse generating unit 304 and the driving unit 305, which is for driving one vibrator, and in the present embodiment, a total of four such circuits are provided.

As a concrete example, a part of the AC voltage generating unit which generates AC voltages applied to an A-phase piezoelectric element will be described. It should be noted that a part of the AC voltage generating unit which generates AC voltages applied to a B-phase piezoelectric element may have the same arrangement as well. The pulse generating unit 304 generates a first A-phase pulse signal and a first A-phase inverted pulse signal which have a frequency and a phase difference corresponding to control parameters relating to a phase difference and a frequency output from the controlled variable computation unit 303. The first A-phase pulse signal and the first A-phase inverted pulse signal, which are input pulse signals, are input to a driving circuit of the driving unit 305. The driving unit 305 causes switching of a DC voltage, which are supplied from a power source 1501, at the input of an input pulse signal to generate a rectangular-wave AC voltage signal.

A step-up circuit 1502 has, for example, a coil 1503 and a transformer 1504. Based on the rectangular-wave AC voltage signal input to the coil 1503 and transformer 1504, the step-up circuit 1502 applies a sin-wave AC voltage boosted to a predetermined driving voltage to the A-phase piezoelectric element. Likewise, the step-up circuit 1502 applies a sin-wave AC voltage boosted to a predetermined driving voltage to the B-phase piezoelectric element.

The first to fourth AC voltages which are output from the driving unit 305 are applied to the piezoelectric elements of the respective vibration-type motors 103, 104, 105, and 106 (hereafter also referred to as M1, M2, M3, and M4, respectively). The vibration-type motors 103 to 106 are individually run according to the first to fourth AC voltages, respectively. As a result, the moving body 102 moves in a direction obtained by vector composition of driving forces of the vibration-type motors 103 to 106.

A position of the moving body 102 is detected by the position sensors 107, 108, and 109. Relative positions between the moving body 102 and the respective vibration-type motors 103, 104, 105, and 106 are detected by detecting the position of the moving body 102 by the position sensors 107, 108, and 109. As described earlier, the position sensors 107, 108, and 109 then output position detecting signals X, Y, and θ, respectively. A position detecting circuit 307 has three position detecting units 307a to 307c, and the position detecting signals X, Y, and θ are given to the position detecting units 307a, 307b, and 307c, respectively.

In response to the position detecting signals, X, Y, and θ, the position detecting units 307a, 307b, and 307c output positional information (detection results) Ex, Ey, and Eθ, respectively, indicating drive positions of the moving body 102 at the sensor locations. The positional information Ex, Ey, and Eθ is input to the XYθ coordinate transformation unit 308. The XYθ coordinate transformation unit 308 subjects the positional information Ex, Ey, and Eθ to a coordinate transformation process and sends the positional information x, y, and θ to the XYθ deviation calculation unit 301. As a result, the feedback control is performed.

Figure 4:
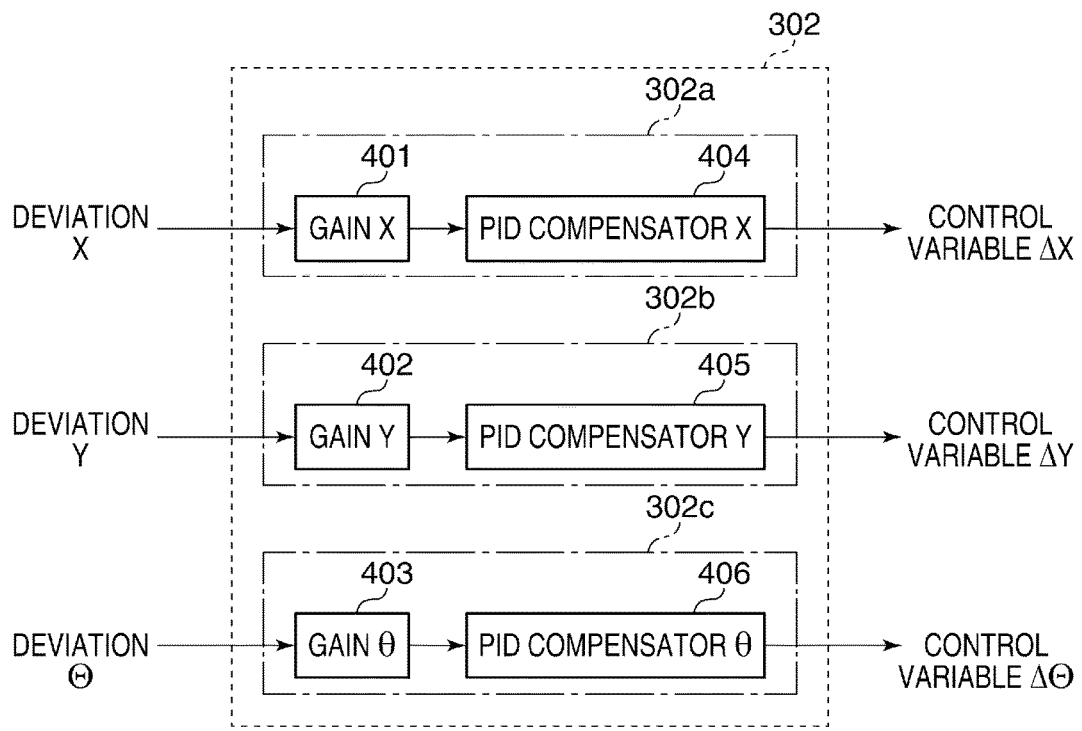
FIG. 4 is a block diagram showing an example of an arrangement of a PID compensation unit appearing in FIG. 3.

FIG. 4 is a block diagram showing an example of an arrangement of the PID compensation unit 302 appearing in FIG. 3.

The PID compensators 302a, 302b, and 302c provided in the PID compensation unit 302 have gain units 401, 402, and 403, respectively, and PID compensators 404, 405, and 406, respectively. The gain units 401, 402, and 403 multiply deviation signals relating to X, Y, and θ by predetermined gains. The PID compensators 404, 405, and 406 then carry out a PID compensation process on the deviation signals multiplied by the gains and output controlled variables ΔX, ΔY, and Δθ.

It should be noted that a gain X, a gain Y, and a gain θ are used to adjust a ratio among control gains in the respective directions. Control gains optimized based on transmission characteristics of the vibration-type motors 103 to 106 are set in the PID compensators 404, 405, and 406.

Figure 5:
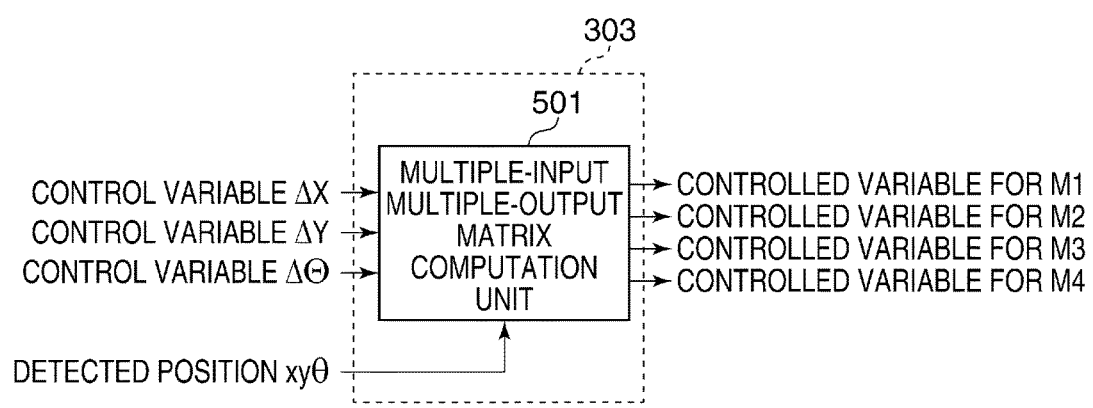
FIG. 5 is a block diagram showing an example of an arrangement of a controlled variable computation unit appearing in FIG. 3.

FIG. 5 is a block diagram showing an example of an arrangement of the controlled variable computation unit 303 appearing in FIG. 3.

The controlled variable computation unit 303 has a multiple-input multiple-output matrix computation unit 501. The controlled variables $\Delta X$, $\Delta Y$, and $\Delta \theta$ and the positional information (also referred to as the detected positions) x, y and $\theta$ described above are input to the multiple-input multiple-output matrix computation unit 501. The multiple-input multiple-output matrix computation unit 501 obtains controlled variables for the vibration-type motors 103 to 106 by performing matrix computations based on the controlled variables $\Delta X$, $\Delta Y$, and $\Delta \theta$ and the positional information x, y and $\theta$. The vibration-type motors 103 to 106 are then controlled based on the obtained controlled variables.

FIGS. 6A to 6C are diagrams useful in explaining the matrix computations performed by the multiple-input multiple-output matrix computation unit 501 appearing in FIG. 5. FIG. 6A shows controlled variables for the vibration-type motors 103 to 106, and FIG. 6B shows a rotation matrix. FIG. 6C shows computations performed using the rotation matrix appearing in FIG. 6B.

The controlled variables M1 to M4 for the vibration-type motors 103 to 106 (M1 to M4) described above are expressed as shown in FIG. 6A. Here, since the driving directions of the vibration-type motors 103 to 106 are each arranged at an inclination of 45 degrees from the XY axis, a coefficient COS (45 deg) is used for multiplication. The first term represents the controlled variable $\Delta X$, the second term represents the controlled variable $\Delta Y$, and the third term represents the controlled variable $\Delta \theta$.

It should be noted that the reason why X and Y elements of vectors are of different signs in the first term and the second term is that all the vibration-type motors are configured to be rotated counterclockwise when driving signals in the same phase are applied to them.

FIG. 6B shows the rotation matrix $R\theta$ for use in computing the controlled variable $\Delta \theta$. The controlled variable $\Delta \theta$ which is a rotational amount is obtained by using a distance d3 from a center point to the vibration-type motors 103 to 106 on the X coordinate axis and the Y coordinate axis in FIG. 6C and with reference to the center point using the rotation matrix $R\theta$. It should be noted that when the moving body 102 moves in the X and Y directions, a central coordinate relative to the vibration-type motors 103 to 106 is displaced, and hence the detected positions x and y are taken into account as offset components.

Figures 7A, 7B:
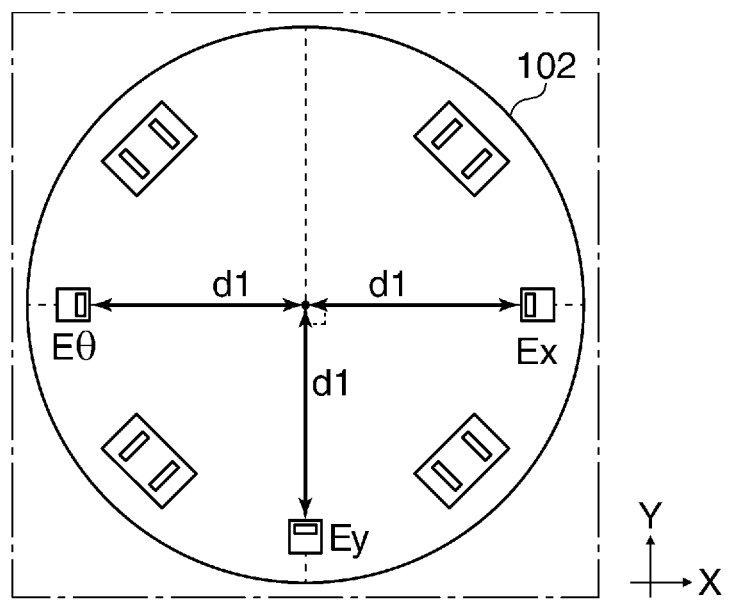
FIGS. 7A and 7B are views useful in explaining a coordinate transformation process which is carried out by an XYθ coordinate transformation unit appearing in FIGS. 1A and 1B.

FIGS. 7A and 7B are views useful in explaining a coordinate transformation process which is carried out by the XY$\theta$ coordinate transformation unit 308 appearing in FIGS. 1A and 1B. FIG. 7A shows equations for use in the coordinate transformation process, and FIG. 7B shows how a position of the moving body 102 is detected.

As shown in FIG. 7B, the position of the moving body 102 is detected by the position sensors 107 to 109. Assume now that a distance from a center point to the position sensors 107 to 109 is d1. As described earlier, the position detecting units 307a, 307b, and 307c output the positional information Ex, Ey, and E$\theta$ at the sensor locations. The XY$\theta$ coordinate transformation unit 308 performs a coordinate transformation of the positional information Ex, Ey, and E$\theta$ into positional information x, y, and $\theta$ by using the equations shown in FIG. 7A. The XY$\theta$ coordinate transformation unit 308 performs the coordinate transformation by using a difference between the positional information Ex and the rotational angle for the X direction, a difference between the positional information Ey and the rotational angle for the Y direction, and a difference between the positional information Ex and E$\theta$ for the $\theta$ direction.

A description will now be given of an arrangement of the pulse width control unit 309 shown in FIG. 3 and how the pulse widths are controlled. Here, undesired power that does not contribute to movement of the moving body 102 is minimized by controlling the pulse widths based on the moving direction of the moving body 102. As described earlier, the speed or the moving direction is controlled by controlling frequencies and phase differences of the vibration-type motors.

Figure 8A:
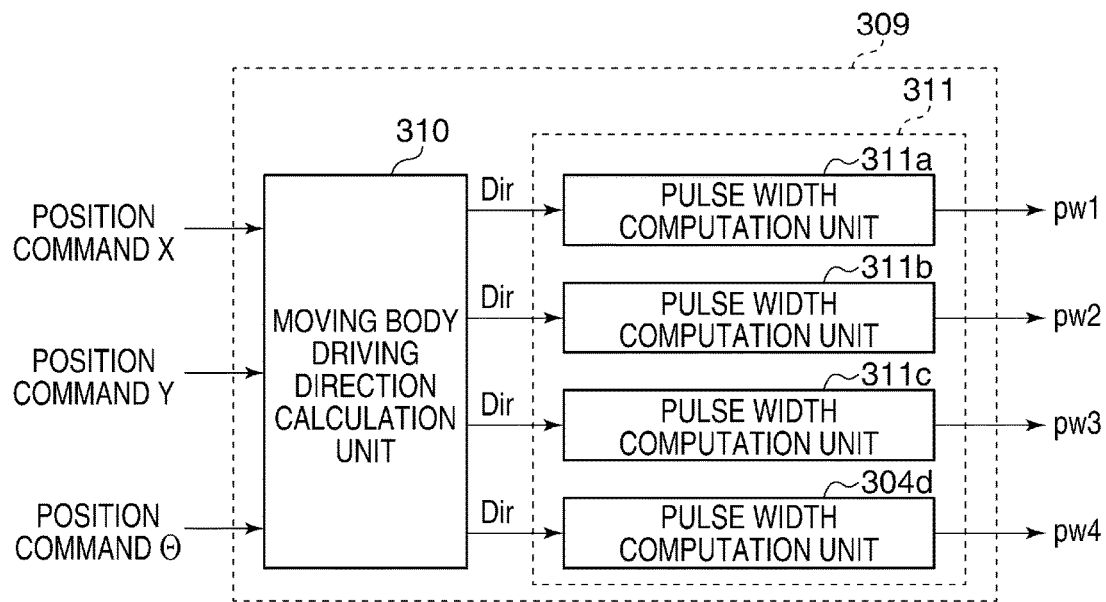
FIGS. 8A and 8B are views useful in explaining an arrangement of a pulse width control unit shown in FIG. 3 and how the pulse width control unit controls pulse widths.
Figure 8B:
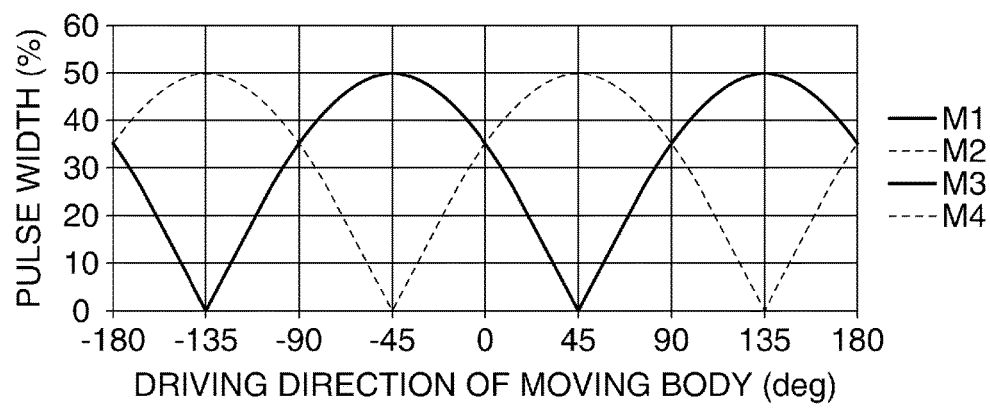

FIGS. 8A and 8B are views useful in explaining the arrangement of the pulse width control unit 309 shown in FIG. 3 and how the pulse width is controlled. FIG. 8A shows the arrangement of the pulse width control unit 309, and FIG. 8B shows outputs from the pulse width control unit 309.

As shown in FIG. 8A, the pulse width control unit 309 has a moving body moving direction calculation unit 310 and a pulse width computation circuit 311. The pulse width computation circuit 311 has four pulse width computation units 311a to 311d.

The moving body moving direction calculation unit 310 obtains a moving direction of the moving body 102 as a moving direction Dir based on the position commands X, Y, and $\theta$. The moving direction Dir is then given to the pulse width computation units 311a to 311d. Based on the moving direction Dir, the pulse width computation units 311a to 311d calculate pulse widths pw1 to pw4 for the vibration-type motors M1 to M4.

It should be noted that the moving direction Dir is successively calculated at intervals of controller control periods. Therefore, the pulse widths for the vibration-type motors M1 to M4 as well are varied with the control periods.

FIG. 8B shows examples of the pulse widths which are output based on the moving directions of the moving body 102. Here, the pulse width for the vibration-type motors M1 and M3 is indicated by a solid line, and the pulse width for the vibration-type motors M2 and M4 is indicated by broken lines.

In the example shown in the figure, the pulse width is continuously varied with the moving directions of the moving body 102, but the pulse width may be discretely changed. Here, in two-dimensional motion in the X-Y plane, there are moving directions (−180 degrees, −90 degrees, 0 degree, 90 degrees) for which the pulse widths for the vibration-type motors M1 to M4 are set to a uniform value. In addition, there are moving directions (−135 degrees, 45 degrees) for which the pulse widths for the vibration-type motors M1 and M3 are set to zero, or moving directions (−45 degrees, 135 degrees) for which the pulse widths for the vibration-type motors M2 and M4 are set to zero. Namely, the voltages of the vibration-type motors M1 to M4 are varied according to the relative angles between the driving directions of the vibration-type motors M1 to M4 and the moving direction of the moving body 102. By varying the voltages according to the relative angles, a moving direction in which the load can be reduced even when the driving voltage is zero may be present among the moving directions of the moving body 102 due to deflecting mechanisms provided in the vibration-type motors M1 to M4 as described later. In other words, the pulse widths, that is, the voltages are varied according to amounts of deflection of the vibration-type motors M1 to M4.

The amounts of deflection are determined by the relative angles between the moving direction of the moving body 102 and axes of the driving directions of the respective vibration-type motors M1 to M4. When the relative angles are large, control is provided so that the voltage amplitudes of the AC voltage applied to the vibration-type motors M1 to M4 can be small. The reason for this is that the driving load is reduced by making the voltage amplitudes small because the amounts of deflection are large when the relative angles are large. Thus, to reduce the driving load with attention focused on variations in the amount of deflection, the feed-forward control by the pulse width control unit 309 over the voltages based on the moving direction is more effective than the feedback control using the positional deviations. Using the feed-forward control over the voltages in addition to the conventional feed-forward control enables the position feedback control over the phase differences or frequencies while driving forces appropriate to the amounts of deflection of the respective vibration-type motors M1 to M4 is being generated, and therefore, power is saved without compromising the ease of control.

FIGS. 9A and 9B are views useful in explaining examples of pulse width calculation equations for use in the pulse width control by the pulse width control unit 309 appearing in FIG. 3. FIG. 9A shows an equation for calculating the moving direction Dir of the moving body 102 by using the position commands X and Y. FIG. 9B shows equations for calculating the pulse widths pw1 to pw4 for the vibration-type motors M1 to M4 by using the moving direction Dir of the moving body 102.

In the pulse width control unit 309, the moving body moving direction calculation unit 310 performs an arctangent computation on the position commands X and Y to calculate the moving direction Dir of the moving body 102 (see FIG. 9A).

Referring now to FIG. 9B, the pulse width computation units 311a to 311d performs cosine computations on the relative angles between the driving directions of the vibration-type motors M1 to M4 and the moving direction Dir. The pulse width computation units 311a to 311d then multiply the cosine computation results by the maximum pulse width, which is set to 50%, to calculate the pulse widths pw1 to pw4.

For example, when the relative angle is 0 degree, the pulse width is 50%, and when the relative angle is 90 degrees, the pulse width is 0%. When the relative angle falls inside the range between not less than 0 degree and not more than 90 degrees, the pulse width varies within the range of 0% to 50% while drawing a sine curve.

It should be noted that the equations shown in FIGS. 9A and 9B are illustrative only, and equations other than the equations shown in FIGS. 9A and 9B may be used as long as the pulse width is varied based on the relative angles between the moving direction Dir of the moving body 102 and the driving directions of the vibration-type motors M1 to M4. For example, if the driving directions of the vibration-type motors M1 to M4 are changed when they are installed, the equations for calculating the relative angles are changed. Moreover, the pulse width may be set discreetly for the moving direction Dir. Further, the maximum value and the minimum value of the pulse width may be changed, a threshold value may be set, and an offset may be partially added.

Figure 10A:
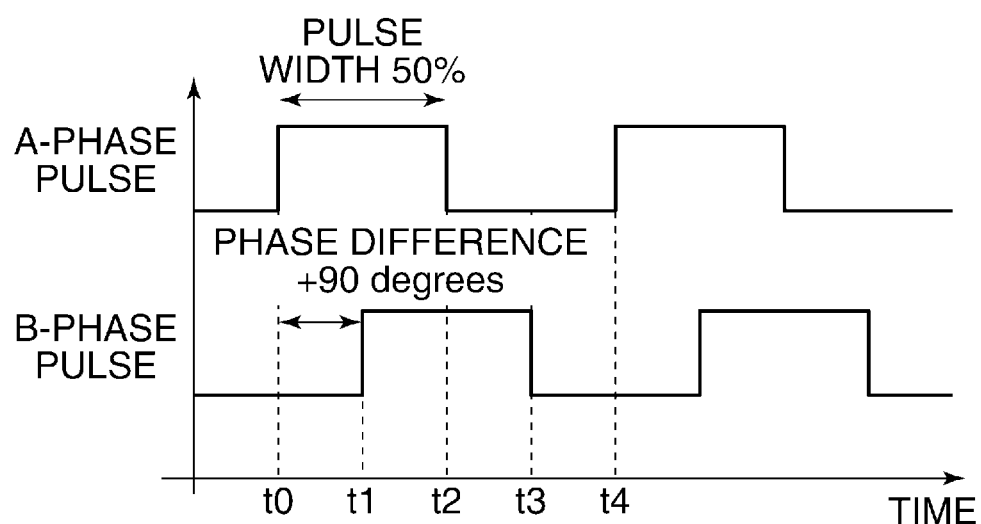
FIGS. 10A and 10B are views useful in explaining variations in the pulse widths of pulse signals which are output from a pulse generating unit appearing in FIG. 3.
Figure 10B:
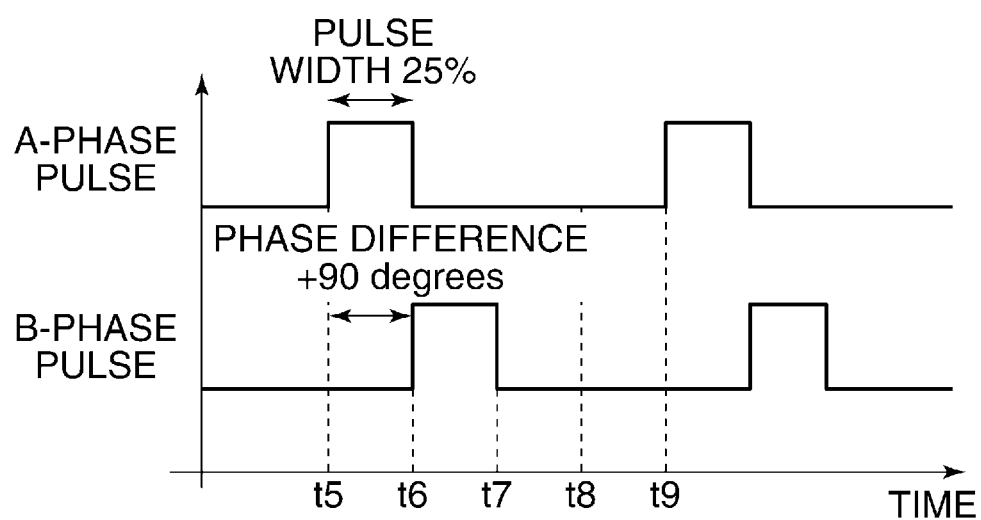

FIGS. 10A and 10B are views useful in explaining variations in the pulse widths of the pulse signals which are output from the pulse generating unit 304. FIG. 10A shows how the pulse signals in the A phase and the B phase vary with time when the pulse width is 50%. FIG. 10B shows how the pulse signals in the A phase and the B phase vary with time when the pulse width is 25%. As shown in FIGS. 9A, 9B, 10A, and 10B, the pulse width control unit 309 controls the pulse widths so that the voltage amplitude of an AC voltage applied to a vibration-type motor the relative angle of which between the driving direction and the moving direction is relatively large can be smaller than the voltage amplitude of an AC voltage applied to a vibration-type motor the relative angle of which is relatively small.

By varying the pulse widths within the range of 0% to 50%, the amplitudes of sin-wave AC voltages are adjusted. In FIG. 10A, one period in which the vibration-type motors M1 to M4 are driven spans from a time t0 to a time t4. The pulse signals in the A phase and the B phase are at an H level (high level) during a time period corresponding to 50% of the period. When the phase difference is set to +90 degrees, the pulse signal in the A phase rises at the time t0, and the pulse signal in the B phase rises at the time t1.

In FIG. 10B, one period in which the vibration-type motors M1 to M4 are driven spans from a time t5 to a time t9. The pulse signals in the A phase and the B phase are at an H level (high level) during a time period corresponding to 25% of the period. When the phase difference is set to +90 degrees, the pulse signal in the A phase rises at the time t5, and the pulse signal in the B phase rises at the time t6.

By varying the pulse widths of the pulse signals in the above described way, the voltages applied to the vibration-type motors M1 to M4 are varied.

Figure 11A:
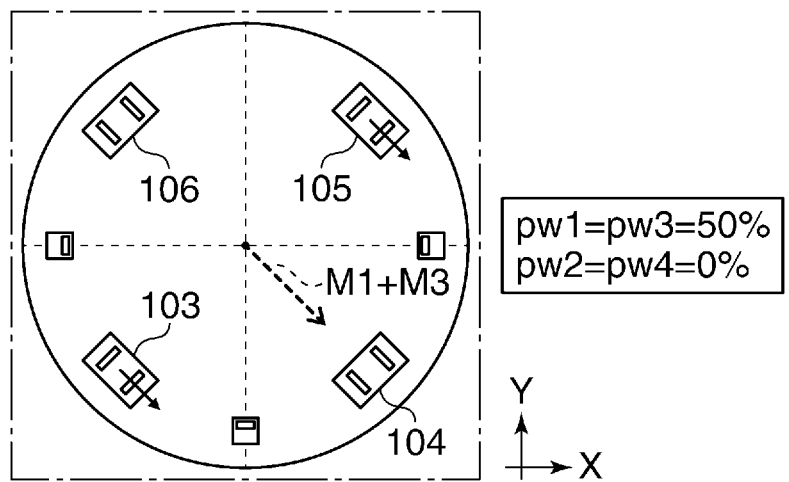
FIGS. 11A to 11D are views useful in explaining examples of operating patterns of the driving apparatus appearing in FIG. 3.
Figure 11B:
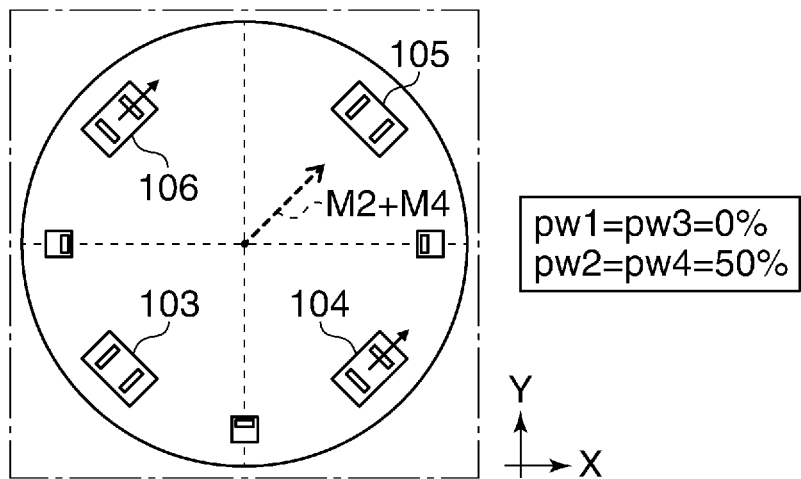
Figure 11C:
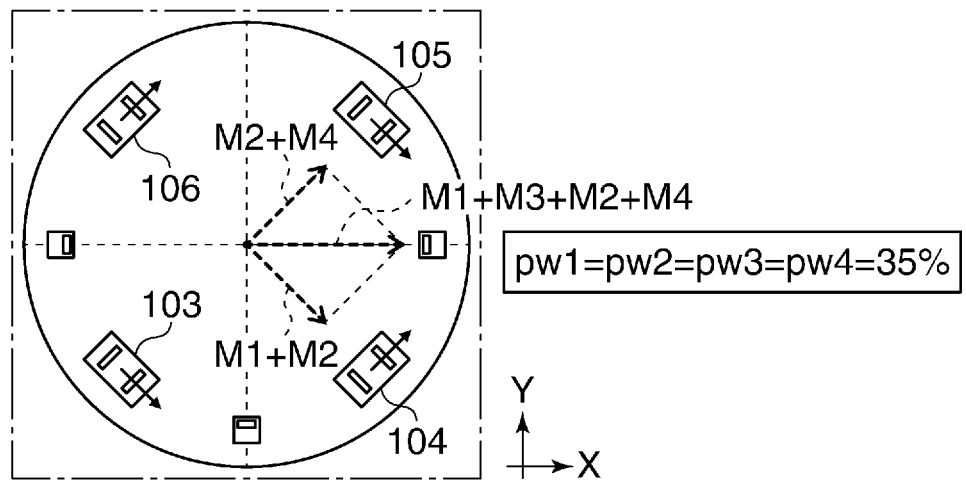
Figure 11D:
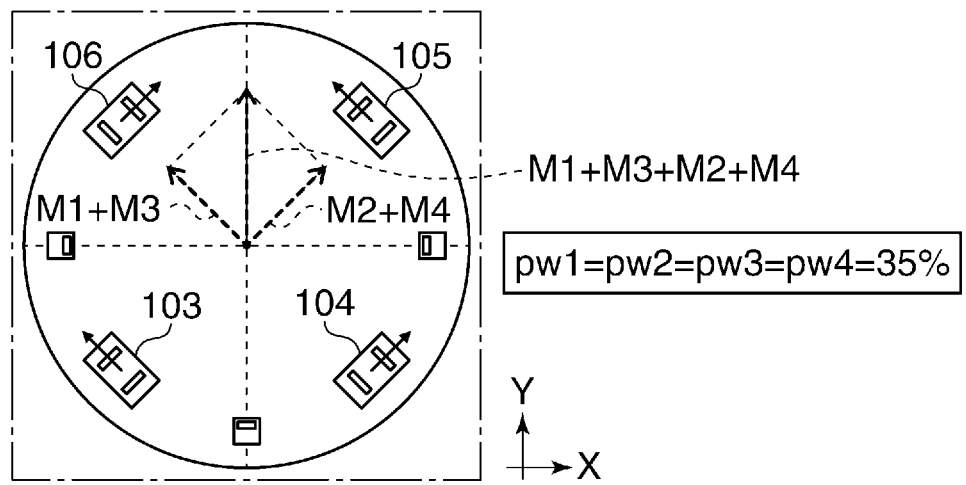

FIGS. 11A to 11D are views useful in explaining examples of operating patterns of the multi-degree of freedom driving apparatus appearing in FIG. 3. FIG. 11A shows a driving pattern in a case where the moving body 102 is driven downward diagonally to the right (−45 degrees), and FIG. 11B shows a driving pattern in a case where the moving body 102 is driven upward diagonally to the right (+45 degrees). FIG. 11C shows a driving pattern in a case where the moving body 102 is driven in the X direction, and FIG. 11D shows a driving pattern in a case where the moving body 102 is driven in the Y direction.

As described earlier, the moving body 102 is driven according to a driving force obtained by vector composition of driving forces of the vibration-type motors 103 to 106. As shown in FIG. 11A, to drive the moving body 102 downward diagonally to the right (−45 degrees), the moving direction of the moving body 102 and the driving direction of the vibration-type motors 103 and 105 correspond to each other. Thus, the vibration-type motors 103 and 105 generate driving forces in the same direction, and hence the pulse width for the vibration-type motors 103 and 105 is set to 50%.

On the other hand, since the relative angle between the driving direction of the vibration-type motor 104 or 106 and the moving direction of the moving body 102 is 90 degrees, no driving force is generated downward diagonally to the right, and merely a transmission unit of the vibration-type motor 104 or 106 is caused to slide by the deflecting mechanism, to be described later. It is thus preferred that the pulse width for the vibration-type motor 104 or 106 is set to 0%. Therefore, particularly in the multi-degree of freedom driving apparatus having the deflecting mechanisms, driving voltages for vibrators subjected to a deflecting action are lowered.

If the multi-degree of freedom driving apparatus has no deflecting mechanism, it may use a method of exciting a stationary wave so as to reduce load resulting from friction with the moving body when the driving direction of the vibration-type motor and the moving direction of the moving body cross each other. In this case, the pulse width is set to approximately 20% to 50%. On the other hand, since in the illustrated examples, the multi-degree of freedom driving apparatus has the deflecting mechanism, to be described later, load resulting from friction with the moving body is reduced without exciting a stationary wave. Namely, the driving voltage for the vibration-type motor subjected to a large amount of deflection is lowered, which optimizes power to be supplied according to the moving direction of the moving body.

It should be noted that the present invention may similarly be applied even to a case where the multi-degree of freedom driving apparatus has no deflecting mechanism because power can be reduced as long as the driving voltage is varied based on the relative angle between the driving direction of the vibration-type motor and the moving direction of the moving body. On this occasion, the minimum pulse width should not be set to 0% but should be offset to 20% with consideration given to reduction of load with a stationary wave. It should be noted that even when the multi-degree of freedom driving apparatus has the deflecting mechanism, the minimum pulse width may be set to an arbitrary value other than 0% to improve the ease of control.

As shown in FIG. 11B, to drive the moving body 102 upward diagonally to the right (+45 degrees), the moving direction of the moving body 102 and the driving direction of the vibration-type motors 104 and 106 correspond to each other. Thus, the vibration-type motors 104 and 106 generate driving forces in the same direction, and hence the pulse width for the vibration-type motors 104 and 106 is set to 50%.

On the other hand, since the relative angle between the driving direction of the vibration-type motor 103 or 105 and the moving direction of the moving body 102 is 90 degrees, and no driving force is generated upward diagonally to the right, the pulse width for the vibration-type motor 103 or 105 is set to 0%.

As shown in FIG. 11C, to drive the moving body 102 in the X direction, the moving body 102 is driven by a driving force obtained by combining driving forces of the vibration-type motors 103 to 106 together. In this case, when a resultant vector (that is, a resultant driving force) of the vibration-type motors 103 and 105 and a resultant vector of the vibration-type motors 104 and 106 are equal to each other, a resultant vector is generated in the X direction. All the relative angles between the driving directions of the vibration-type motors 103 to 106 and the moving direction of the moving body 102 are 45 degrees. Namely, all the vibration-type motors 103 to 106 generate the same driving force and have a uniform amount of deflection with respect to the travel distance of the moving body 102. Therefore, the driving voltage is evenly distributed, and all the pulse widths for the vibration-type motors 103 to 106 are set to 35%.

As shown in FIG. 11D, to drive the moving body 102 in the Y direction, the moving body 102 is driven by a driving force obtained by combining driving forces of the vibration-type motors 103 to 106 together as with the case in FIG. 11C. In this case, all the relative angles between the driving directions of the vibration-type motors 103 to 106 and the moving direction of the moving body 102 are 45 degrees. Therefore, the pulse widths for all the vibration-type motors 103 to 106 are set to 35%.

By making the rotational directions of driving vectors for all the vibration-type motors 103 to 106 equal, it is possible to rotate the moving body 102. In this case, all the pulse widths for the vibration-type motors 103 to 106 are set to an equal value. Thus, since the moving body 102 is driven in the X and Y directions, and in addition, its rotation is controlled, the present invention can be used to, for example, lock the moving body 102.

Figure 12:
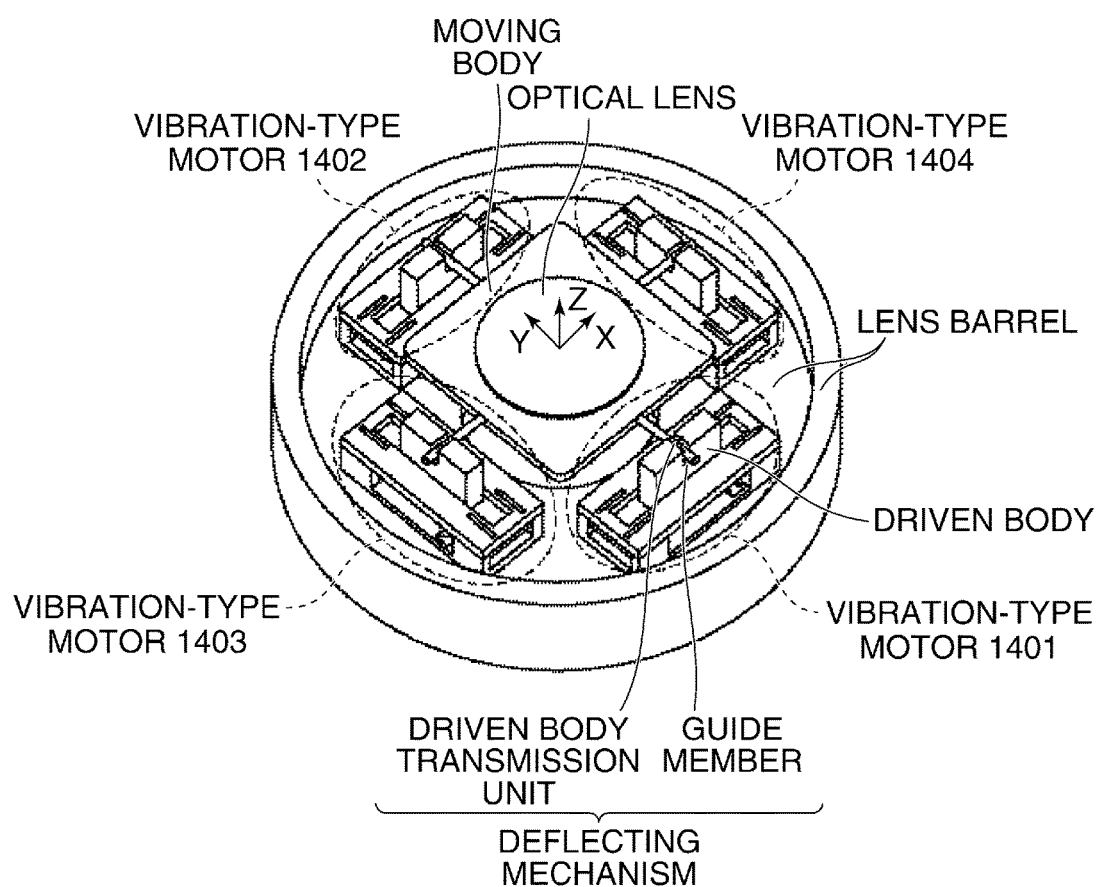
FIG. 12 is a view useful in explaining an example of a deflecting mechanism for use in the driving apparatus appearing in FIGS. 1A and 1B.

FIG. 12 is a view useful in explaining an example of the deflecting mechanism for use in the multi-degree of freedom driving apparatus appearing in FIGS. 1A and 1B.

In the example shown in the figure, an optical lens is mounted on a moving body, which is equipped with four guide members shaped like round bars. The guide members are extended in an X direction and a Y direction from a center of the moving body. Vibration-type motors 1401 to 1404 are in contact with the moving body, and ends of the guide members are arranged on the respective vibration-type motors 1401 to 1404. The vibration-type motors 1401 to 1404 are fixed to a lens barrel.

The vibration-type motors 1401 to 1402 are driven in the X direction. To move the moving body in the X direction, the vibration-type motors 1403 and 1404 are able to deflect frictional load by means of their deflecting mechanisms in which driven body transmission units and the guide members slide in the X direction. On the other hand, to move the moving body in the Y direction, the vibration-type motors 1401 and 1402 is caused to slide in the Y direction by their deflecting mechanisms.

Using such deflecting mechanisms enables the multi-degree of freedom driving apparatus to save power without compromising the ease of control.

Figure 13:
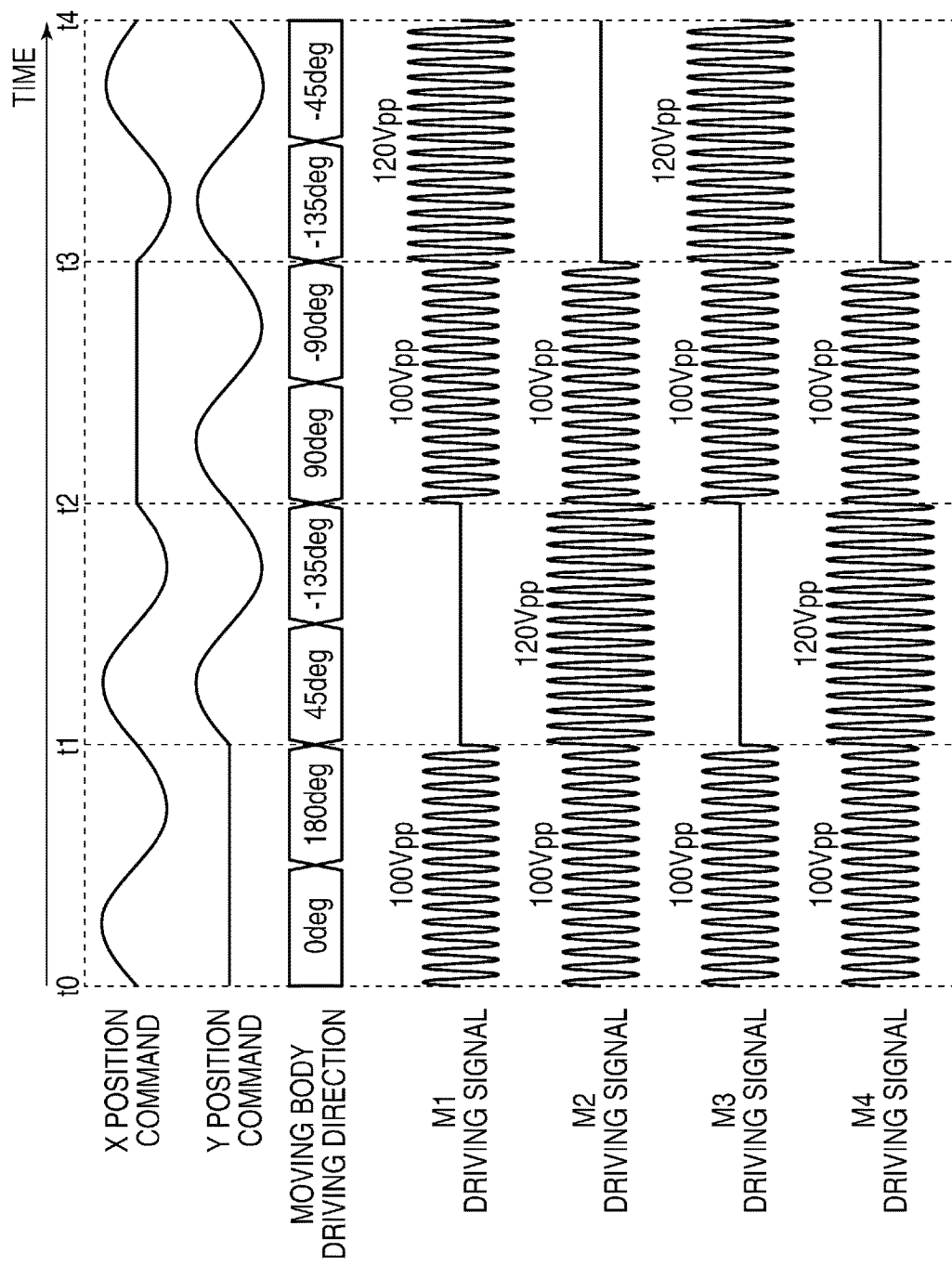
FIG. 13 is a diagram showing examples of variations with time in driving signals for the vibration-type motors in the driving apparatus appearing in FIG. 3.
Figure 14A:
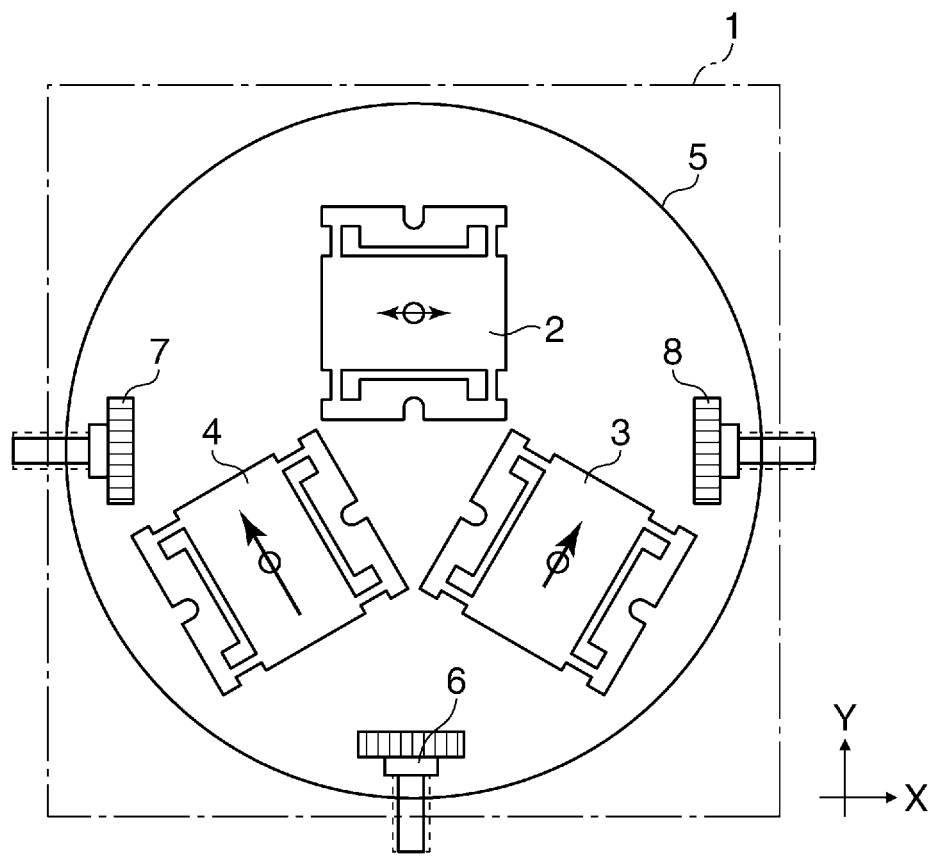
FIGS. 14A and 14B are views useful in explaining an example of a conventional driving apparatus.
Figure 14B:
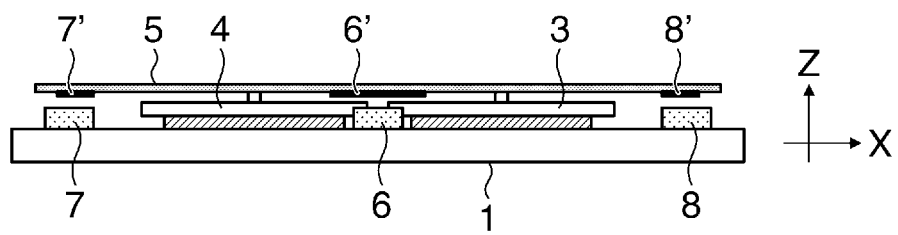

FIG. 13 is a diagram showing examples of variations with time in driving signals for the vibration-type motors in the multi-degree of freedom driving apparatus appearing in FIG. 3.

In FIG. 13, the horizontal axis represents time, and the vertical axis represents position commands for the X and Y directions. It is assumed that the position commands have an amplitude of ±1 mm and a frequency of 5 Hz. FIG. 13 also shows how voltage amplitudes of the driving signals for the vibration-type motors M1 to M4 vary from a time t0 to a time t4 during which the moving direction of the moving body varies.

As shown in the figure, a sin-wave AC voltage of 120 Vpp is applied to the piezoelectric element when the pulse width is 50%, a sin-wave AC voltage of 100 Vpp is applied to the piezoelectric element when the pulse width is 35%, and a sin-wave AC voltage of 0 Vpp is applied to the piezoelectric element when the pulse width is 0%. The moving body moves back and forth in the ±X direction from the time t0 to the time t1. In this case, a driving voltage of 100 Vpp for the vibration-type motors M1 to M4 is output from the time t0 to the time t1.

The moving body moves back and forth in the direction of +45 degrees/−135 degrees from the time t1 to the time t2. In this case, the transmission units of the vibration-type motors M1 and M3 are caused to slide by the deflecting mechanisms, and hence a driving voltage of 0 Vpp is output. On the other hand, a driving voltage of 120 Vpp is output for the vibration-type motors M2 and M4.

The moving body moves back and forth in the ±Y direction from the time t2 to the time t3. In this case, a driving voltage of 100 Vpp for the vibration-type motors M1 to M4 is output. The moving body moves back and forth in the direction of +135 degrees/−45 degrees from the time t3 to the time t4. In this case, the transmission units of the vibration-type motors M2 and M4 are caused to slide by the deflecting mechanisms, and hence a driving voltage of 0 Vpp is output. On the other hand, a driving voltage of 120 Vpp is output for the vibration-type motors M1 and M3.

Here, power consumed by the vibration-type motors M1 to M4 when moving the moving body back and forth in the direction of +45 degrees/−135 degrees is compared with that in the conventional multi-degree of freedom driving apparatus.

Assume that in the conventional multi-degree of freedom driving apparatus, all of driving voltages are set to 120 Vpp. In this case, power consumption is 2.1 W. On the other hand, in the multi-degree of freedom driving apparatus according to the present embodiment, power consumption is 1.1 W, which is 48% lower than that in the conventional multi-degree of freedom driving apparatus. As for the ease of control, the same results are obtained. The minimum pulse width for the vibration-type motors, the transmission units of which are caused to slide by the deflecting mechanisms, does not always have to be 0%, and even when the minimum pulse width is set to 18%, power consumption is as low as 1.6 W.

By using the multi-degree of freedom driving apparatus described above for an anti-vibrating mechanism of a camera, an anti-vibrating operation is performed based on a position command (that is, an amount of shake) from a gyroscopic sensor (not shown). Then, control is provided to successively vary pulse widths for four vibration-type motors based on moving directions within a two-dimensional plane, and hence power is saved in the anti-vibrating operation.

As described above, in the embodiment of the present invention, since the driving voltages for the vibration-type motors are varied according to the moving directions of the moving body, power consumption is reduced without compromising the ease of control.

It should be noted that the present invention may be applied to cases where a moving body is driven in multiple directions by using a plurality of vibration-type motors. For example, the present invention may be applied to a case where a moving body is driven in X, Y, and θ directions by using three vibration-type motors, and a case where a moving body is driven in X and Y directions by using two vibration-type motors. Moreover, although in the embodiment described above, the vibration-type motors are each configured to have the two electrodes as shown in FIGS. 2A to 2D, the present invention may be implemented by vibration-type motors with other arrangements as long as they are able to generate driving force through vibrations. Examples of such vibration-type motor include a vibration-type motor having two or more electrodes as described in, for example, Japanese Laid-Open Patent Publication (Kokai) No. H06-311765.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-237535, filed Dec. 7, 2016 and Japanese Patent Application No. 2017-213926, filed Nov. 6, 2017 which are hereby incorporated by reference herein in their entirety.

What is claimed is:

1. A driving apparatus that has a first vibrator vibrated through application of a plurality of first AC voltages, and a second vibrator vibrated through application of a plurality of second AC voltages, and moves a moving body by a driving force of the first vibrator and a driving force of the second vibrator, comprising:
   a detecting unit configured to detect a position of the moving body:
   a first control unit configured to control a voltage amplitude of the plurality of first AC voltages and a voltage amplitude of the plurality of second AC voltages; and
   a second control unit configured to control each of the first vibrator and the second vibrator based on a deviation between a driving command for moving the moving body and a result of detection by the detecting unit while the plurality of first AC voltages and the plurality of second AC voltages are being controlled by the first control unit,
   wherein a driving direction of the first vibrator and a driving direction of the second vibrator cross each other,
   wherein the first control unit is configured to control the voltage amplitude of the plurality of first AC voltages based on a relative angle between a moving direction of the moving body, which is indicated by the driving command, and the driving direction of the first vibrator, and
   wherein the first control unit is configured to control the voltage amplitude of the plurality of second AC voltages based on a relative angle between the moving direction of the moving body and the driving direction of the second vibrator.

2. A driving apparatus that has a first vibrator vibrated through application of a plurality of first AC voltages, and a second vibrator vibrated through application of a plurality of second AC voltages, and moves a moving body by a driving force of the first vibrator and a driving force of the second vibrator, comprising:
   a detecting unit configured to detect a position of the moving body:

a first control unit configured to feed-forward control a voltage amplitude of the plurality of first AC voltages and a voltage amplitude of the plurality of second AC voltages; and a second control unit configured to feedback control each of the first vibrator and the second vibrator based on a deviation between a driving command for moving the moving body and a result of detection by the detecting unit, wherein a driving direction of the first vibrator and a driving direction of the second vibrator cross each other, wherein the first control unit is configured to feed-forward control the voltage amplitude of the plurality of first AC voltages based on a relative angle between a moving direction of the moving body, which is indicated by the driving command, and the driving direction of the first vibrator, and wherein the first control unit is configured to feed-forward control the voltage amplitude of the plurality of second AC voltages based on a relative angle between the moving direction of the moving body and the driving direction of the second vibrator.

3. The driving apparatus according to claim 1, wherein, when the relative angle between the moving direction and the driving direction of the first vibrator is larger than the relative angle between the moving direction and the driving direction of the second vibrator, the first control unit provides control to make the voltage amplitude of the plurality of first AC voltages smaller than the voltage amplitude of the plurality of second AC voltages.

4. The driving apparatus according to claim 1, wherein the second control unit controls the first vibrator by controlling at least one of a phase difference and a frequency of the plurality of first AC voltages based on the deviation, and controls the second vibrator by controlling at least one of a phase difference and a frequency of the plurality of second AC voltages based on the deviation.

5. The driving apparatus according to claim 1, wherein, when the relative angle has been changed due to a change in the driving command, the first control unit provides control to change each of the voltage amplitudes of the plurality of first AC voltages and the plurality of second AC voltages.

6. The driving apparatus according to claim 1, wherein the first control unit controls each of the voltage amplitudes of the plurality of first AC voltages and the plurality of second AC voltages based on a computation result obtained by a cosine computation on the relative angle between the driving direction and a drive shaft for the first vibrator and the second vibrator.

7. The driving apparatus according to claim 1, further comprising a load reduction unit configured to reduce load generated when the moving body is moved in such a direction as to cross the driving direction of the first vibrator or the driving direction of the second vibrator.

8. The driving apparatus according to claim 1, wherein the second control unit comprises:
a compensation unit configured to obtain a first controlled variable based on the deviation; and
a generating unit configured to, based on the first controlled variable, generate a second controlled variable for each of the first vibrator and the second vibrator.

9. The driving apparatus according to claim 1, further comprising:
a pulse generating unit configured to generate pulse signals; and a driving circuit configured to generate AC voltages according to the pulse signals,
wherein the pulse signals generated by the pulse generating unit are controlled by the first control unit and the second control unit.

10. The driving apparatus according to claim 9, wherein the first control unit controls the voltage amplitude of the plurality of first AC voltages by controlling a pulse width of a first pulse signal generated by the pulse generating unit, and controls the voltage amplitude of the plurality of second AC voltages by controlling a pulse width of a second pulse signal generated by the pulse generating unit.

11. The driving apparatus according to claim 1, further comprising:
a third vibrator configured to be vibrated through application of a plurality of third AC voltages;
a fourth vibrator configured to be vibrated through application of a plurality of fourth AC voltages; and
a base plate on which the first vibrator, the second vibrator, the third vibrator, and the fourth vibrator are arranged,
wherein the driving direction of the third vibrator and the driving direction of the fourth vibrator cross each other,
the first vibrator is placed in a first quadrant of a plane parallel to a drive shaft of the first vibrator on the base plate,
the second vibrator is placed in a second quadrant of the plane,
the third vibrator is placed in a third quadrant of the plane, and
the fourth vibrator is placed in a fourth quadrant of the plane.

12. The driving apparatus according to claim 11, wherein the driving direction of the first vibrator and a driving direction of the third vibrator are parallel to each other, and
the first control unit provides control to make the voltage amplitude of the plurality of first AC voltages and the voltage amplitude of the plurality of third AC voltages equal to each other.

13. An electronic apparatus comprising:
a driving apparatus according to claim 1; and
a moving body configured to be driven by the driving apparatus.

14. The electronic apparatus according to claim 13, wherein the moving body is equipped with an optical lens.

15. A control method for a driving apparatus that has a first vibrator vibrated through application of a plurality of first AC voltages, and a second vibrator vibrated through application of a plurality of second AC voltages, a driving direction of the first vibrator and a driving direction of the second vibrator crossing each other, and drives the moving body by a resultant driving force obtained by combining a driving force of the first vibrator and a driving force of the second vibrator together, the control method comprising:
a first control step of controlling a voltage amplitude of the plurality of first AC voltages and a voltage amplitude of the plurality of second AC voltages;
a detecting step of detecting a position of the moving body; and
a second control step of controlling each of the first vibrator and the second vibrator based on a deviation between a driving command for moving the moving body and a result of detection in the detecting step while the plurality of first AC voltages and the plurality of second AC voltages are being controlled in the first control step, wherein in the first control step, the voltage amplitude of the plurality of first AC voltages is controlled based on a relative angle between a moving direction of the moving body, which is indicated by the driving command, and the driving direction of the first vibrator, and wherein in the first control step, the voltage amplitude of the plurality of second AC voltages is controlled based on a relative angle between the moving direction of the moving body and the driving direction of the second vibrator.

16. The control method for a driving apparatus according to claim 15, wherein the voltage amplitude of the plurality of first AC voltages and the voltage amplitude of the plurality of second AC voltages are feed-back controlled in the first control step.

17. A non-transitory computer-readable storage medium storing a program for causing a computer to execute a control method for a driving apparatus that has a first vibrator vibrated through application of a plurality of first AC voltages, and a second vibrator vibrated through application of a plurality of second AC voltages, a driving direction of the first vibrator and a driving direction of the second vibrator crossing each other, and drives the moving body by a resultant driving force obtained by combining a driving force of the first vibrator and a driving force of the second vibrator together, the control method comprising:

a first control step of controlling a voltage amplitude of the plurality of first AC voltages and a voltage amplitude of the plurality of second AC voltages;

a detecting step of detecting a position of the moving body; and a second control step of controlling each of the first vibrator and the second vibrator based on a deviation between a driving command for moving the moving body and a result of detection in the detecting step while the plurality of first AC voltages and the plurality of second AC voltages are being controlled in the first control step, wherein in the first control step, the voltage amplitude of the plurality of first AC voltages is controlled based on a relative angle between a moving direction of the moving body, which is indicated by the driving command, and the driving direction of the first vibrator, and wherein in the first control step, the voltage amplitude of the plurality of second AC voltages is controlled based on a relative angle between the moving direction of the moving body and the driving direction of the second vibrator.

18. A driving apparatus that has a first vibrator and a second vibrator, and relatively moves a contact body by a driving force of the first vibrator and a driving force of the second vibrator, comprising:

a control unit configured to control each of the first vibrator and the second vibrator based on a driving command for moving the contact body, wherein a driving direction of the first vibrator and a driving direction of the second vibrator cross each other, wherein the control unit is configured to control a voltage applied with the first vibrator based on a relative angle between a moving direction of the contact body, which is indicated by the driving command, and the driving direction of the first vibrator.

19. The driving apparatus according to claim 18, wherein the control unit is configured to control a voltage applied with the second vibrator based on a relative angle between the moving direction of the contact body and the driving direction of the second vibrator.

20. The driving apparatus according to claim 18, further comprising a detecting unit configured to detect a position of the contact body.

21. The driving apparatus according to claim 18, wherein the control unit is configured to feed-forward control a voltage amplitude of an AC voltage applied with the first vibrator based on the relative angle between the moving direction of the contact body and the driving direction of the first vibrator.

22. The driving apparatus according to claim 18, wherein, when the relative angle between the moving direction and the driving direction of the first vibrator is larger than a relative angle between the moving direction and the driving direction of the second vibrator, the control unit provides control to make a voltage amplitude of a first AC voltage applied with the first vibrator smaller than a voltage amplitude of a second AC voltage applied with the second vibrator.

23. The driving apparatus according to claim 18, wherein the control unit controls the first vibrator by controlling at least one of a phase difference and a frequency of a first AC voltage applied with the first vibrator, and controls the second vibrator by controlling at least one of a phase difference and a frequency of a second AC voltage applied with the second vibrator.

24. The driving apparatus according to claim 18, further comprising a load reduction unit configured to reduce load generated when the contact body is relatively moved in such a direction as to cross the driving direction of the first vibrator or the driving direction of the second vibrator.

25. The driving apparatus according to claim 18, wherein the control unit comprises:

a compensation unit configured to obtain a first controlled variable based on the deviation; and a generating unit configured to, based on the first controlled variable, generate a second controlled variable for each of the first vibrator and the second vibrator.

26. The driving apparatus according to claim 18, further comprising:

a pulse generating unit configured to generate pulse signals; and a driving circuit configured to generate an AC voltage according to the pulse signals, wherein the pulse signals are controlled by the control unit.

27. The driving apparatus according to claim 18, further comprising:

a third vibrator;

a fourth vibrator; and a base plate on which the first vibrator, the second vibrator, the third vibrator, and the fourth vibrator are arranged, wherein a driving direction of the third vibrator and a driving direction of the fourth vibrator cross each other, the first vibrator is placed in a first quadrant of a plane parallel to a drive shaft of the first vibrator on the base plate, the second vibrator is placed in a second quadrant of the plane, the third vibrator is placed in a third quadrant of the plane, an the fourth vibrator is placed in a fourth quadrant of the plane.

28. The driving apparatus according to claim 27, wherein the driving direction of the first vibrator and the driving direction of the third vibrator are parallel to each other, and the control unit provides control to make a voltage amplitude of a first AC voltage applied with the first vibrator and a voltage amplitude of a third AC voltage applied with the third vibrator substantially equal to each other.

29. An electronic apparatus comprising:
a driving apparatus according to claim 18; and
a contact body configured to be relatively driven by the driving apparatus.

30. The electronic apparatus according to claim 29, wherein the contact body is equipped with an optical lens.

31. A control method for a driving apparatus that has a first vibrator and a second vibrator, a driving direction of the first vibrator and a driving direction of the second vibrator crossing each other, and drives a contact body by a driving force of the first vibrator and a driving force of the second vibrator, the control method comprising:
a first control step of controlling a voltage applied with the first vibrator and a second vibrator; and
a second control step of controlling each of the first vibrator and the second vibrator,
wherein a voltage applied with the first vibrator is controlled based on a relative angle between a moving direction of the contact body, which is indicated by the driving command, and the driving direction of the first vibrator.

32. The control method for a driving apparatus according to claim 31,
wherein a voltage applied with the second vibrator is controlled based on a relative angle between the moving direction of the contact body, which is indicated by the driving command, and the driving direction of the second vibrator.

33. A non-transitory computer-readable storage medium storing a program for causing a computer to execute a control method for a driving apparatus has a first vibrator and a second vibrator, a driving direction of the first vibrator and a driving direction of the second vibrator crossing each other, and drives a contact body by a driving force of the first vibrator and a driving force of the second vibrator, the control method comprising:
a first control step of controlling a voltage applied with the first vibrator and a second vibrator; and
a second control step of controlling each of the first vibrator and the second vibrator,
wherein a voltage applied with the first vibrator is controlled based on a relative angle between a moving direction of the contact body, which is indicated by the driving command, and the driving direction of the first vibrator.

* * * * *